United States Patent
Staszewski et al.

(10) Patent No.: US 7,555,057 B2
(45) Date of Patent: Jun. 30, 2009

(54) PREDISTORTION CALIBRATION IN A TRANSCEIVER ASSEMBLY

(75) Inventors: Robert B. Staszewski, Garland, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 688 days.

(21) Appl. No.: 10/749,654

(22) Filed: Dec. 31, 2003

(65) Prior Publication Data

US 2004/0151257 A1 Aug. 5, 2004

Related U.S. Application Data

(60) Provisional application No. 60/441,080, filed on Jan. 17, 2003.

(51) Int. Cl.
H04K 1/02 (2006.01)
H04L 25/03 (2006.01)
H04L 25/49 (2006.01)

(52) U.S. Cl. .................. 375/296; 375/297; 375/232; 310/10; 310/129

(58) Field of Classification Search .......... 375/285, 375/296, 297, 232; 455/296–312; 310/10, 310/129
See application file for complete search history.

(56) References Cited

U.S. PATENT DOCUMENTS

| | | | |
|---|---|---|---|
| 5,489,879 A | 2/1996 | English | |
| 6,191,653 B1 * | 2/2001 | Camp et al. | 330/129 |
| 6,212,229 B1 | 4/2001 | Salinger | |
| 6,304,140 B1 | 10/2001 | Thron et al. | |
| 6,366,177 B1 * | 4/2002 | McCune et al. | 332/103 |
| 6,373,902 B1 * | 4/2002 | Park et al. | 375/296 |
| 6,429,736 B1 | 8/2002 | Parry et al. | |
| 6,476,670 B1 | 11/2002 | Wright et al. | |
| 6,549,067 B1 * | 4/2003 | Kenington | 330/52 |
| 6,711,388 B1 * | 3/2004 | Neitiniemi | 455/127.1 |
| 6,724,255 B2 * | 4/2004 | Kee et al. | 330/251 |
| 6,794,931 B2 * | 9/2004 | Kenington | 330/10 |
| 2002/0034260 A1 * | 3/2002 | Kim | 375/296 |
| 2002/0080891 A1 * | 6/2002 | Ahn et al. | 375/297 |
| 2002/0098871 A1 | 7/2002 | Hildebrand et al. | |
| 2003/0083724 A1 * | 5/2003 | Jog et al. | 607/122 |
| 2003/0095607 A1 | 5/2003 | Huang et al. | |

* cited by examiner

*Primary Examiner*—Phuong Phu
(74) *Attorney, Agent, or Firm*—Ronald O. Neerings; Wade James Brady, III; Frederick J. Telecky, Jr.

(57) ABSTRACT

Systems and methods are provided for calibrating a digital predistorter in an integrated transceiver circuit. A digital transmitter path provides a signal from a digital input. The transmitter path includes a digital predistorter that predistorts the digital input to mitigate nonlinearities associated with a power amplifier. The integrated transceiver circuit further includes a receiver path associated with the digital transmitter path. A coupling element provides the signal from the transmitter path to the receiver path. A signal evaluator determines values for at least one parameter associated with the digital predistorter based on the signal.

23 Claims, 4 Drawing Sheets

PREDISTORTION CALIBRATION IN A TRANSCEIVER ASSEMBLY

CROSS REFERENCE TO RELATED APPLICATION

This application claims the benefit of U.S. Provisional Application No. 60/441,080, which was filed Jan. 17, 2003, and entitled "Type-II All-Digital PLL in Deep-Submicron CMOS", the entire contents of which is incorporated herein by reference.

TECHNICAL FIELD

The present invention is directed to communications systems and more specifically to an integrated transceiver having predistortion calibration.

BACKGROUND OF THE INVENTION

The use of deep-submicron CMOS processes allows for an unprecedented degree of integration in digital circuitry, but complicates the implementation of traditional RF and analog circuits. For example, frequency tuning of a low-voltage deep-submicron CMOS oscillator is a challenging task due to its highly nonlinear frequency behavior with degradation in voltage and low voltage headroom. This makes it susceptible to the variations in the power or ground supply and substrate noise. A low supply voltage can negatively impact the dynamic range of the signal and result in an increasing noise floor, thus further degrading the signal-to-noise ratio. At times, it is possible to find a specific solution, such as utilizing a voltage doubler. Unfortunately, with each CMOS feature size reduction, the supply voltage needs to be scaled down to ensure the reliability of the circuit.

The high degree of integration can lead to the generation of substantial digital switching noise that is coupled through the power supply network and substrate into noise sensitive analog circuits. Furthermore, the advanced CMOS processes typically use low resistance P-substrate which is an effective means in combating latchup problems, but exacerbates substrate noise coupling into the analog circuits. This problem only gets worse with scaling down of the supply voltage.

SUMMARY OF THE INVENTION

In one aspect of the invention, an integrated transceiver circuit is provided. A digital transmitter path provides a signal from a digital input. The transmitter path includes a digital predistorter that predistorts the digital input to mitigate non-linearities associated with a power amplifier. The integrated transceiver circuit further includes a receiver path associated with the digital transmitter path. A coupling element provides the signal from the transmitter path to the receiver path. A signal evaluator determines values for at least one parameter associated with the digital predistorter based on the signal.

In accordance with another aspect of the invention, a method is provided for calibrating a predistortion component in a transceiver system. A first digital signal is provided to a transmitter path. The first digital signal contains amplitude information related to a desired analog signal. A second digital signal is provided to a transmitter path. The second digital signal contains phase information related to the desired analog signal. At least one of the first digital signal and the second digital signal are predistorted in the digital domain according to at least one predistortion parameter. An analog signal is generated from the first digital signal and the second digital signal. The analog signal is processed at a receiver path associated with the transmitter path to determine values for the at least one predistortion parameter.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention is directed to an integrated transceiver circuit having a digital predistorter. A transmitter path in the transceiver includes a digital predistorter that distorts a digital input associated with a desired output of the transmitter according to one or more predistortion parameters. For example, the predistortion can mitigate distortion due to non-linear behavior of a power amplifier associated with the transceiver. The predistorter is calibrated by providing a portion of the transmitter output to the receiver path of the transceiver. The receiver processes and digitizes the signal and provides the digitized signal to a digital processor for analysis. The digital processor determines appropriate predistortion parameters for the predistorter. The transmitter path can also include one or more normalization components that convert digital inputs to the transmitter from a normalized domain to a process-voltage-temperature (PVT)-dependent domain. The predistortion can be conducted in the normalized domain to reduce the complexity of the predistorter.

Figure 1:
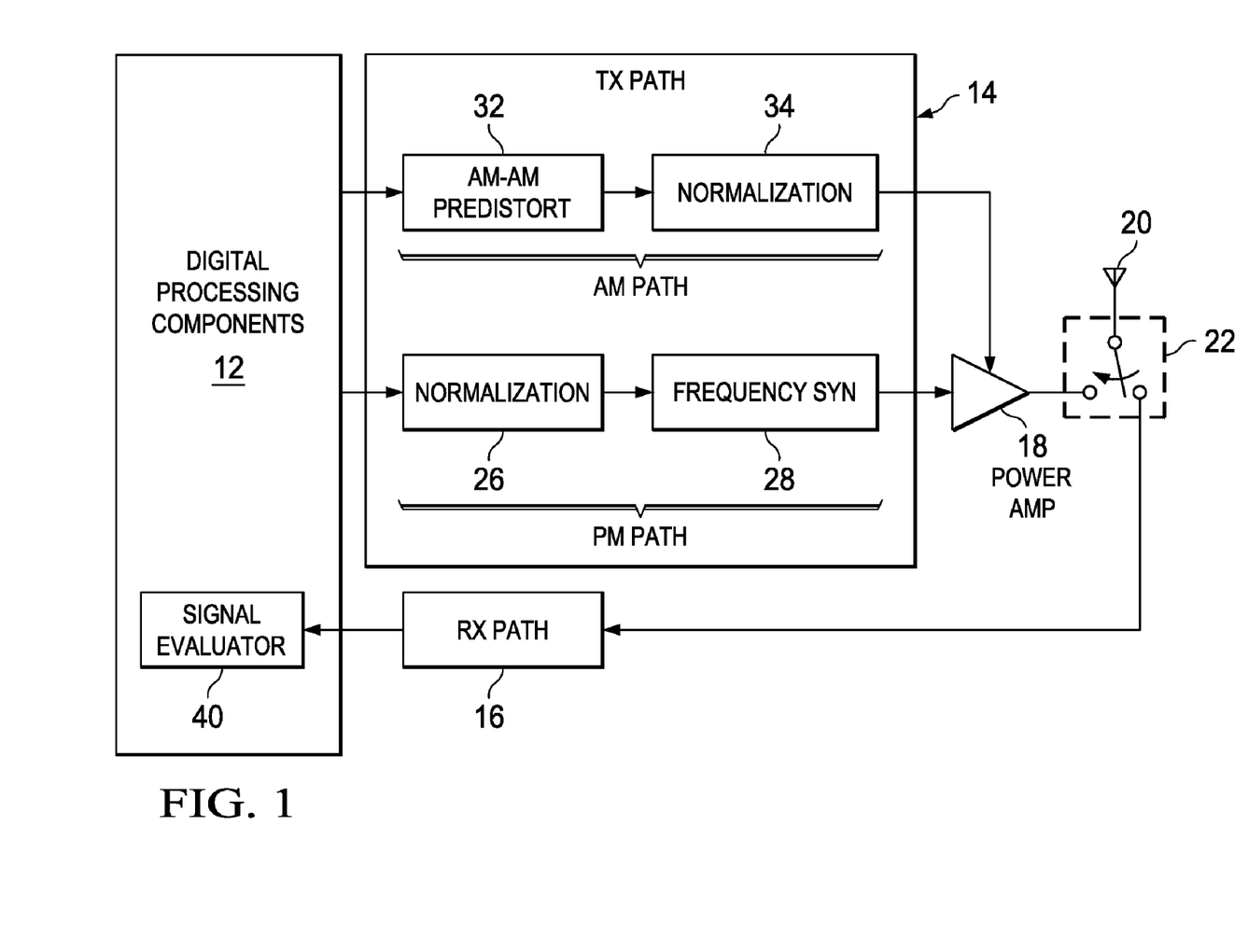
FIG. 1 illustrates a transceiver system in accordance with the present invention.

FIG. 1 illustrates a transceiver system 10 in accordance with the present invention. The illustrated system comprises a digital processor 12, a transmitter path 14, a receiver path 16, a power amplifier 18, and an antenna 20. The illustrated system is a time-division duplex (TDD) system that can assume a transmission mode and a receiving mode at alternating times. The system can be switched to the antenna 20 between these modes via a transmit/receive (T/R) switch assembly 22 controlled by the digital processor 12. It will be appreciated that one or more of the digital baseband processor 12, the transmitter 14 and the receiver 16 and the power amplifier 18 can be implemented as an integrated circuit on a single deep sub-micron CMOS chip.

In the transmission mode, the digital processor 12 controls the transmitter path 14 to provide a modulated signal to the power amplifier 18. The power amplifier 18 amplifies the modulated signal and provides it to the antenna 20 for transmission. In the receiving mode, an analog signal is received at the antenna and provided to the receiver path. The analog signal is processed, for example, filtered and downconverted, and digitized on the receiver path, and a digital representation of the signal is provided to the processor assembly.

The illustrated system can be calibrated to provide updated parameters for the at least one predistorter. This calibration can be performed once in the factory, each time the transceiver is powered, or periodically during the operation of the transceiver. During calibration, a signal is provided to the power amplifier 18 through the transmission path 14 as two digital inputs. A digital phase input corresponding to a desired analog signal is provided to the transmitter path 14 along a phase modulated (PM) path. The digital phase input is normalized to the expected parameters of the system to allow the digital processor 12 and other components on the phase modulated (PM) path (not shown) to operate in a normalized domain. Specifically, any phase information associated with the normalized tuning word is normalized to an expected clock period of oscillator. Any frequency information associated with the digital phase input is normalized to an external reference frequency. Further information concerning the phase and frequency normalization can be found in U.S. Published Patent application 2003/0133522, filed May 22, 2002, which is assigned to the assignee of the present application, and the contents of this application are hereby incorporated by reference.

A PM path normalization component 26 adjusts the normalized phase input for the current variations in the condition of the system. The result is a digital input that is dependent on any of process, voltage, and temperature (PVT) variations within the system. The PVT-dependent signal is operative to produce a desired radio frequency (RF) signal at an associated frequency synthesizer 28 given the present conditions of the system. For example, the normalization component 26 can adjust for changes in the temperature and voltage experienced by the system components. The frequency synthesizer 28 produces an RF signal according to the PVT-dependent digital input. For example, the frequency synthesizer 28 can comprise a digitally controlled oscillator. The frequency synthesizer provides a radio frequency (RF) input signal to the power amplifier 18.

A second digital input is provided to the amplitude modulated (AM) path to control the amplitude of the output of the power amplifier 18. For example, the second digital input can control a supply voltage for the power amplifier 18, or can be provided to another component (e.g., an internal power amplifier) to control the amplitude of the power amplifier 18 output. The signal is received at a digital predistorter 32. The digital predistorter 32 predistorts the digital input to account for nonlinear behavior of the power amplifier 18. The distorting behavior of the predistorter 32 is controlled by one or more predistortion parameters. These parameters can represent, for example, filter coefficients or values within a look-up table.

The predistorted signal is then provided to a gain normalization component 34 on the amplitude modulated path. It will be appreciated that the digital predistorter 32, and the digital processor 12 all operate within a normalized domain, such that the inputs and outputs of the components are normalized to standard system parameters (e.g., a reference voltage or an outermost circle on an I/Q constellation). This simplifies the operation and design of these components. The gain normalization component 34 adjusts the digital input for variations in the behavior of the power amplifier 18 and components in the amplitude path due to changes in condition of the system as to convert the amplitude modulated path input from the normalized domain to a PVT-dependent domain. The result is a digital input that can produce a desired amplitude at the power amplifier given the present characteristics of the system. For example, the gain normalization component 34 can adjust for changes in the temperature and voltage experienced by the system components. Once the signal has been converted to the PVT-dependent domain, it is applied to a suitable control mechanism for the amplitude of the output of the power amplifier 18.

A portion of the power amplifier output is provided to the receiver path 16 through a coupling element (not shown). The coupling element can comprise a coupler that directly provides a portion of the power amplifier output to the receiver path 16. Alternatively, the coupling element can comprise the T/R switch 22, with the signal reaching the receiver path 16 through parasitic leakage through the switch. In the receiver path 16, the signal is processed to convert the signal into a digital signal that is suitable for digital processing. This process can include sampling, downconversion, filtering, and, of course, analog-to-digital conversion of the signal. The digital signal produced by the receiver path 16 is then provided to a signal evaluator 40 associated with the digital processor 12. The signal evaluator 40 measures the spectral regrowth of the signal as the power of the signal in frequency channels outside of a desired frequency range or channel. Appropriate predistortion parameters for the digital predistorter 32 can be calculated from the measured signal power to mitigate this spectral regrowth.

Figure 2:
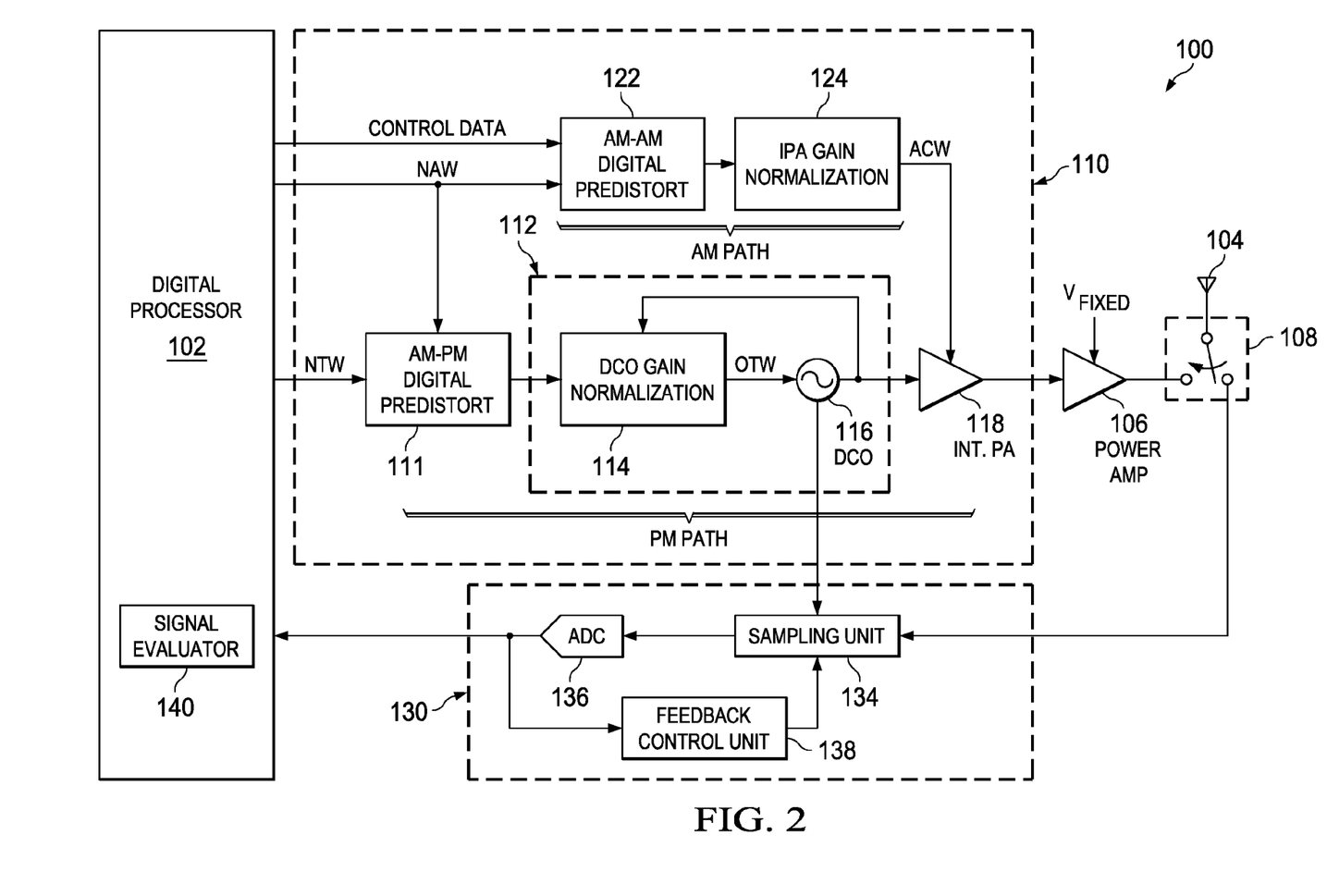
FIG. 2 illustrates an exemplary mobile digital transceiver system in accordance with the present invention.

FIG. 2 illustrates an exemplary mobile digital transceiver system 100 in accordance with the present invention. The transceiver system comprises a digital processor 102, an antenna 104, an external power amplifier 106, a transmitter portion 110 and a receiver portion 130. The transceiver system 100 can select between a transmit mode and a receive mode at a T/R switch 108 connecting the antenna to the transmitter 110 and the receiver 130. It will be appreciated that the digital processor, the transmitter 110 and the receiver 130 can be implemented as an integrated circuit on a single deep sub-micron CMOS chip.

The transmitter portion 110 receives two digital signals representing a desired output signal from the digital processor. A normalized amplitude word is provided to an amplitude modulated (AM) path of the transmitter 110. A normalized tuning word (NTW) is provided to an AM-PM digital predistorter 111 on a phase modulated (PM) path of the transmitter 110. The AM-PM predistorter 111 adjusts the normalized tuning word to mitigate changes in the phase (or delay time) of the power amplifier output associated with variations of amplitude within the power amplifier output. The external power amplifier 106 and various components within the transceiver (e.g., an internal power amplifier 118) can cause a delay within their respective output signals that vary with the amplitude of the signals.

The AM-PM predistorter 111 corrects for this induced delay according to the expected amplitude of the signal. The expected amplitude can be derived from a normalized amplitude word (NAW) associated with the AM path of the transmitter 110. For example, the AM-PM predistorter 111 can be implemented as a look-up table that contains a phase correction for each amplitude or a digital filter that can be tuned to provide an appropriate delay into the normalized tuning word according to the derived amplitude. Alternatively, the AM-PM predistorter 111 can be implemented as a parameterized function. It will be appreciated that the AM-PM predistortion does not need to be performed on a normalized digital input. For example, the AM-PM predistorter can be located downstream of a normalization component (e.g., 114) and receive PVT-dependent phase and amplitude inputs.

The predistorted normalized tuning word is provided to a frequency synthesizer 112 along a phase modulation path. The frequency synthesizer 112 can be implemented using one or more digital phase-locked loops. The normalized tuning word represents a desired frequency variation for the output signal from a center frequency associated with the system. Within the frequency synthesizer 112, the normalized tuning word is received at a digitally controlled oscillator (DCO) gain normalization component 114. The DCO gain normalization component 114 converts the normalized input from a normalized domain to a PVT-dependent domain, and to provide an oscillator tuning word associated with a digitally controlled oscillator 116. For example, the DCO gain normalization component 114 can adjust the signal for current variations in the temperature and voltage of one or more components from standard values.

The digitally-controlled oscillator 116 generates an output with a frequency of oscillation $f_V$ that is a physically-inherent function of the digital oscillator tuning word (OTW) input. The frequency of oscillation is generally a nonlinear function of the OTW. However, within a limited range of operation, the action of the digitally controlled oscillator 116 can be approximated by a linear transfer function, such that:

$$f_V = f_0 + \Delta f_V = f_0 + K_{DCO} * OTW \qquad \text{Eq. 1}$$

where $\Delta f_V$ is a deviation from a certain center frequency $f_0$ and $K_{DCO}$ is a gain coefficient.

$K_{DCO}$ can be defined as a frequency deviation $\Delta f_V$ (in Hz) from a certain oscillating frequency $f_V$ in response to one least significant bit (LSB) of change in the OTW. Within a linear range of operation, $K_{DCO}$ can also be expressed as:

$$K_{DCO} = \frac{\Delta f_V}{\Delta OTW} \qquad \text{Eq. 2}$$

where $\Delta(OTW)$ designates a change in the OTW value.

Due to its analog nature, the $K_{DCO}$ gain is subject to process and environmental factors which cannot be known precisely, so an estimate thereof, $K'_{DCO}$, must be determined. The estimate $K'_{DCO}$ can be calculated entirely in the digital domain by observing phase error responses to the past DCO phase error corrections. The actual DCO gain estimation involves arithmetic operations, such as multiplication or division, and averaging, and can be performed, for example, by dedicated hardware or a digital signal processor (DSP).

The gain normalization component 114 utilizes this estimate to decouple the phase and frequency information throughout the system from the PVT variations that normally affect the DCO 116. The phase information is normalized to a clock period $T_V$ of the oscillator, whereas the frequency information is normalized to the value of an external reference frequency $f_R$. The digital input to the DCO gain normalization 114 is a fixed-point normalized tuning word (NTW), whose integer part LSB corresponds to $f_R$. The DCO gain normalization 114 applies a multiplier to the predistorted NTW, the normalized domain input, to obtain the oscillator tuning word (OTW), a PVT-dependent domain input, such that:

$$OTW = NTW * \frac{f_R / LSB}{K'_{DCO}} \qquad \text{Eq. 3}$$

The oscillator tuning word from the DCO gain normalization component 114 is provided to the digitally controlled oscillator 116. The digitally controlled oscillator 116 provides a digital-to-frequency conversion to produce an RF signal having a desired frequency from the oscillator tuning word. The RF signal is a periodic waveform whose frequency is a function of the normalized tuning word. The digitally controlled oscillator can be implemented as a digital application specific integrated circuit (ASIC) cell, having digital inputs and outputs. The output of the digitally controlled oscillator 116 is provided to an internal power amplifier (IPA) 118 as an input signal.

A normalized amplitude word (NAW) is provided from the digital processor to a digital AM-AM predistorter 122 along an amplitude modulation path. The digital AM-AM predistorter 122 applies a predistortion to the normalized amplitude word to adjust for nonlinear behavior of the external power amplifier 106 and the internal power amplifier 118. Conceptually, the nonlinearities introduced to the signal by the external power amplifier 106 and the internal power amplifier 118 can be represented as a transfer function. The AM-AM predistorter 122 applies a transfer function to the normalized amplitude word that is inverse to the transfer function represented by the power amplifiers 106 and 118. This inverse function is defined by one or more predistortion parameters provided as control data from the digital processor 102. By way of example, the digital AM-AM predistorter 122 can be implemented as a digital filter, with the predistortion parameters comprising filter coefficients of the digital filter. Alternatively, the digital AM-AM predistorter can be implemented as a look-up table, with the predistortion parameters representing values of the look-up table. Furthermore, the digital AM-AM predistorter can be implemented as a parameterized function.

The predistorted signal is then provided to an internal power amplifier (IPA) gain normalization component 124. It will be appreciated that the digital AM-AM predistorter 122, and the digital processor 102 all operate within a normalized domain, such that the inputs and outputs of the components are normalized to standard system parameters (e.g., a reference voltage or the outermost circle on an I/Q constellation). This simplifies the operation and design of these components. The IPA normalization component 124 adjusts the normalized amplitude word for current variations in the behavior of one or more of the external power amplifier 106, the internal power amplifier 118, and components in the amplitude path due to changes in condition of the system to remove the amplitude modulated path signal from the normalized domain. The result is an amplitude control word that can produce a desired amplitude at the internal power amplifier 118 given the present characteristics of the system. For example, the IPA normalization component 124 can adjust for changes in the temperature and voltage experienced by the system components.

The IPA gain normalization component 124 operates in much the same fashion as the DCO gain normalization device. The exact gain provided by the power amplifier for a particular input is subject to process and environmental factors which cannot be known precisely, so an estimate thereof, $K'_{IPA}$, must be determined. The estimate $K'_{IPA}$ can be calculated entirely in the digital domain by observing responses to past gain corrections. The actual IPA gain estimation may involve arithmetic operations, such as multiplication or division and averaging, or an exhaustive or iterative search for an optimal solution and can be performed, for example, by dedicated hardware or a digital signal processor (DSP).

The IPA gain normalization component 124 utilizes this estimate to decouple the amplitude information throughout the system from the PVT variations that normally affect the internal power amplifier 118. The amplitude information is normalized to a standardized voltage, $V_0$. The digital input to the IPA gain normalization 124 is a fixed-point normalized amplitude word (NAW), whose integer part LSB corresponds to $V_0$. The IPA gain normalization 124 applies a multiplier to the normalized amplifier word, the normalized domain input, to obtain the amplifier control word, a PVT-dependent domain input, such that:

$$ACW = NAW * \frac{V_0/LSB}{K'_{IPA}} \qquad \text{Eq. 4}$$

The amplitude control word is provided as a supply input or a digital word input to the internal power amplifier 118. In the illustrated example, the internal power amplifier 118 can be implemented as a class E switching amplifier, comprising a series of digital switches and a matching network. A discussion of an exemplary class E switching amplifier can be found in U.S. Published patent application 2002/0180547, filed Nov. 22, 2002, which is assigned to the assignee of the present application, and the contents of this application are hereby incorporated by reference. The internal power amplifier 118 amplifies the RF signal provided by the frequency synthesizer 112 with a supply determined by the amplitude control word and provides the amplified signal to the external power amplifier 106. The amplitude of the internal power amplifier 118 output can be controlled by a digital word applied to the series of switches. For example, the internal power amplifier 118 can be operated at saturation, with the supply dynamically controlled by the amplifier control word. The external power amplifier 106 amplifies the received signal using a fixed supply voltage. The amplified signal can be provided to the antenna 104 for transmission.

A portion of the amplified RF signal can be provided to the receiver portion 130 for analysis via parasitic coupling at the T/R switch 108 for calibration of the AM-AM predistorter 122. A signal for calibration can also be provided to the receiver 130 through a test multiplexer pin (not shown) or a coupler (not shown) integrated into the integrated transceiver chip. Calibration can be performed using a signal transmitted during normal operation of the transmitter or the transmitter portion 110 can provide a test signal that contains a full range of signals for the system. The calibration process can be performed at the factory, each time the unit is powered, or periodically during the operation of the transceiver. The receiver portion 130 and the transmitter portion 110 utilize a common local oscillator, so the carrier signal will have a frequency equal to that of the local oscillator of the receiver 130. Thus, when the signal is demodulated at the receiver 130, it will contain a strong DC component along with other, less prominent signals within the desired channel. The nonlinear behavior of the external power amplifier 106 and the internal power amplifier 118 can cause spectral regrowth, causing the signal to spread to frequencies outside of the desired frequency range or channel.

The attenuated copy of the signal is provided to a sampling unit 134. In the illustrated example, the sampling unit 134 samples the provided RF signal directly, without the need for prior analog downconverting of the signal. An exemplary sampling unit for this purpose can be found in U.S. Published patent application 2003/0035499, filed Jul. 8, 2002, which is assigned to the assignee of the present application, and the contents of this application are hereby incorporated by reference. The output of the sampling unit is provided to an analog-to-digital converter (ADC) 136 that converts the sampled signal into a digital signal. In an exemplary embodiment, the ADC 136 is a sigma-delta ADC that utilizes a sigma-delta modulator, a comparatively low resolution but high speed ADC, and a decimation filter to achieve high-resolution analog-to-digital conversion over the frequency band of interest. The output of the ADC 136 is fed back to a feedback control unit 138.

The feedback control unit 138 works in conjunction with the sampling unit to measure the DC level at the filter and apply the correction necessary to eliminate it. The removal of the DC component allows for a more sensitive measurement of the spectral regrowth within the signal. The corrected signal is provided to a signal evaluation component 140, associated with the digital processor 102. The signal evaluation component 140 measures the spectral regrowth in the signal and calculates appropriate predistortion parameters to mitigate the measured spectral regrowth. These parameters are then provided to the digital AM-AM predistorter 122 as a control input.

Figure 3:
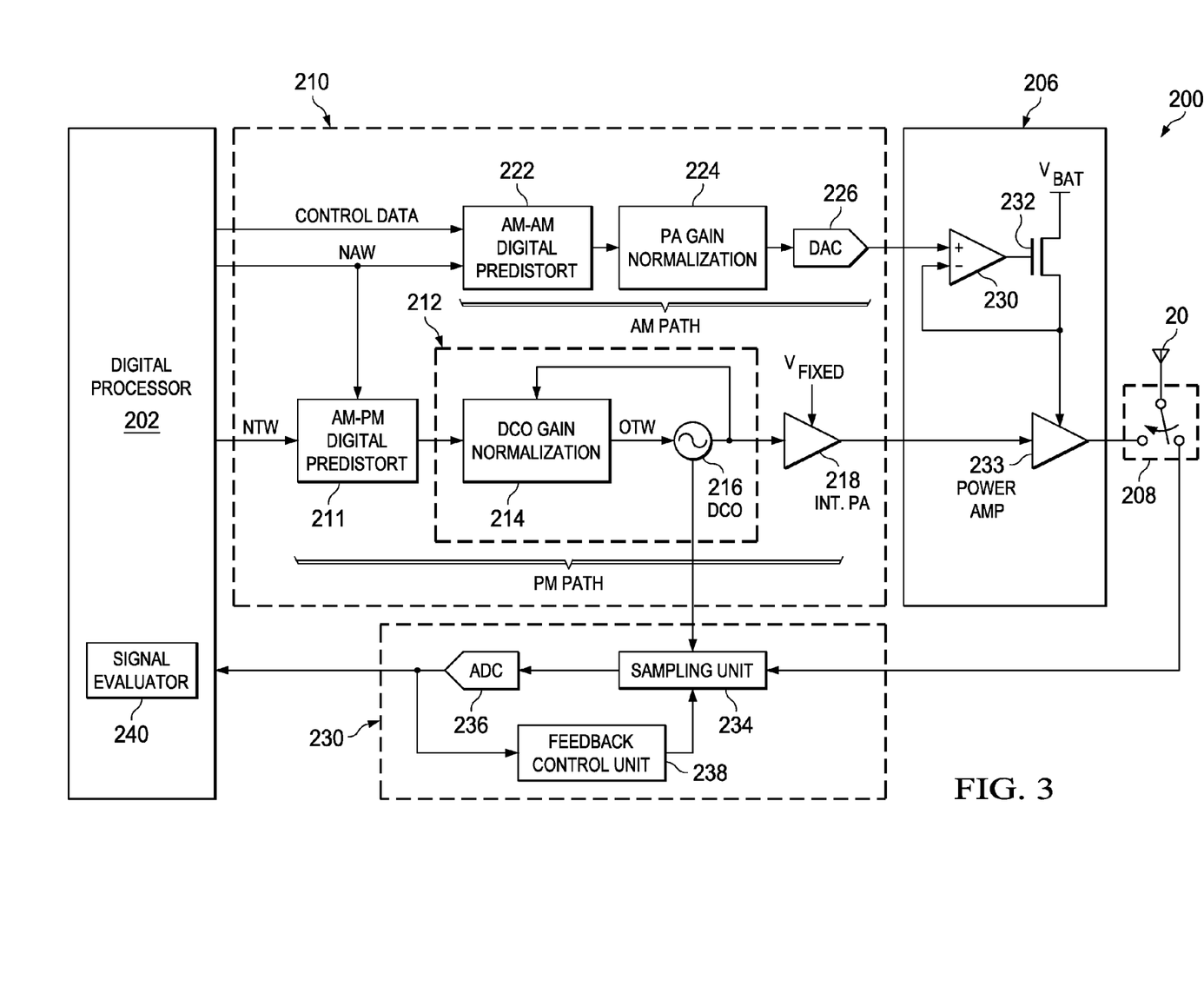
FIG. 3 illustrates another exemplary mobile digital transceiver system in accordance with the present invention.

FIG. 3 illustrates an exemplary mobile digital transceiver system 200 in accordance with the present invention. The illustrated system is intended to operate as a pulse amplitude modulation (PAM) system, such that information can be carried through the phase and amplitude of the signal. For example, the system can be utilized as part of an Enhanced Data for GSM Evolution (EDGE) modulation scheme. The transceiver system comprises a digital processor 202, an antenna 204, an external power amplifier module 206, a transmitter portion 210 and a receiver portion 240. The transceiver system 200 can select between a transmit mode and a receive mode at a T/R switch 208 connecting the antenna to the transmitter 210 and the receiver 230. It will be appreciated that the digital processor 202, the transmitter 210 and the receiver 230 can be implemented on a single deep sub-micron CMOS chip.

The transmitter portion 210 receives two digital signals representing a desired output signal from the digital processor. A normalized amplitude word is provided to an amplitude modulated (AM) path of the transmitter 210. A normalized tuning word (NTW) is provided to an AM-PM digital predistorter 211 on a phase modulated (PM) path of the transmitter 210. The AM-PM predistorter 211 adjusts the normalized tuning word to mitigate changes in the phase (or delay time) of the power amplifier output associated with variations of amplitude within the power amplifier output. The external power amplifier 206 and various components within the transceiver (e.g., an internal power amplifier 218) can cause a delay within their respective output signals that vary with the amplitude of the signals.

The AM-PM predistorter 211 corrects for this induced delay according to the expected amplitude of the signal. The expected amplitude can be derived from a normalized amplitude word (NAW) associated with the AM path of the transmitter 210. For example, the AM-PM predistorter 211 can be implemented as a look-up table that contains a phase correction for each amplitude or a digital filter that can be tuned to provide an appropriate delay into the normalized tuning word according to the derived amplitude. It will be appreciated that the AM-PM predistortion does not need to be performed on a normalized digital input. For example, the AM-PM predistorter can be located downstream of a normalization component (e.g., 214) and receive PVT-dependent phase and amplitude inputs.

The predistorted normalized tuning word is provided to a frequency synthesizer 212 along a phase modulation path. The frequency synthesizer 212 can be implemented using one or more digital phase-locked loops. The normalized tuning word represents a desired frequency variation for the output signal from a center frequency associated with the system. Within the frequency synthesizer 212, the normalized tuning word is received at a digitally controlled oscillator (DCO) gain normalization component 214. The DCO gain normalization component 214 calibrates the normalized tuning word such that the input provided to a digitally controlled oscillator 216 is properly adjusted for PVT variations of the system.

The digitally-controlled oscillator (DCO) 216 generates an output with a frequency of oscillation $f_V$ that is a physically-inherent function of the digital oscillator tuning word (OTW) input. The frequency of oscillation is generally a nonlinear function of the OTW. However, within a limited range of operation, the action of the digitally controlled oscillator 216 can be approximated by a linear transfer function, such that:

$$f_V = f_0 + \Delta f_V = f_0 + K_{DCO} * OTW \quad \text{Eq. 5}$$

where $\Delta f_V$ is a deviation from a certain center frequency $f_0$ and $K_{DCO}$ is a gain coefficient.

$K_{DCO}$ can be defined as a frequency deviation $\Delta f_V$ (in Hz) from a certain oscillating frequency $f_V$ in response to one least significant bit (LSB) of change in the OTW. Within a linear range of operation, $K_{DCO}$ can also be expressed as:

$$K_{DCO} = \frac{\Delta f_V}{\Delta OTW} \quad \text{Eq. 6}$$

where $\Delta(OTW)$ designates a change in the OTW value.

Due to its analog nature, the $K_{DCO}$ gain is subject to process and environmental factors which cannot be known precisely, so an estimate thereof, $K'_{DCO}$, must be determined. The estimate $K'_{DCO}$ can be calculated entirely in the digital domain by observing phase error responses to the past DCO phase error corrections. The actual DCO gain estimation involves arithmetic operations, such as multiplication or division, and averaging, and can be performed, for example, by dedicated hardware or a digital signal processor (DSP).

The gain normalization component 214 utilizes this estimate to decouple the phase and frequency information throughout the system from the PVT variations that normally affect the DCO 216. The phase information is normalized to a clock period $T_V$ of the oscillator, whereas the frequency information is normalized to the value of an external reference frequency $f_R$. The digital input to the DCO gain normalization 214 is a fixed-point normalized tuning word (NTW), whose integer part LSB corresponds to $f_R$. The DCO gain normalization 214 applies a multiplier to the predistorted NTW, the normalized domain input, to obtain the oscillator tuning word (OTW), a PVT-dependent domain input, such that:

$$OTW = NTW * \frac{f_R / LSB}{K'_{DCO}} \quad \text{Eq. 7}$$

The oscillator tuning word from the DCO gain normalization component 214 is provided to the digitally controlled oscillator 216. The digitally controlled oscillator 216 provides a digital-to-frequency conversion to produce an RF signal having a desired frequency from the tuning word. The RF signal is a periodic waveform whose frequency is a function of the normalized tuning word. The digitally controlled oscillator can be implemented as a digital application specific integrated circuit (ASIC) cell, having digital inputs and outputs. The output of the digitally controlled oscillator 216 is provided to an internal power amplifier (IPA) 218 as an input signal. The internal power amplifier 218 amplifies the signal according to a fixed digital input to its supply terminal to produce a constant envelope RF signal. The RF signal is provided as an input signal to the external power amplifier 206.

A normalized amplitude word (NAW) is provided from the digital processor to a digital AM-AM predistorter 222 along an amplitude modulation path. The digital AM-AM predistorter 222 applies a predistortion to the normalized amplitude word to adjust for nonlinear behavior of the external power amplifier 206 and the internal power amplifier 218. Conceptually, the nonlinearities introduced to the signal by the power amplifiers 206 and 218 can be represented as a transfer function. The predistorter 222 applies a transfer function to the normalized tuning word that is inverse to the transfer function represented by the power amplifiers 206 and 218. This inverse function is defined by one or more predistortion parameters provided as control data from the digital processor 202. By way of example, the digital AM-AM predistorter 222 can be implemented as a digital filter, with the predistortion parameters comprising filter coefficients of the digital filter. Alternatively, the digital AM-AM predistorter can be implemented as a look-up table, with the predistortion parameters representing values of the look-up table. Furthermore, the digital AM-AM predistorter can be implemented as a parameterized function.

The predistorted signal is then provided to a power amplifier (PA) gain normalization component 224. It will be appreciated that the digital AM-AM predistorter 222, and the digital processor 202 all operate within a normalized domain, such that the inputs and outputs of the components are normalized to standard system parameters (e.g., a reference voltage). This simplifies the operation and design of these components. The PA normalization component 224 adjusts the normalized amplitude word for current variations in the behavior of the external power amplifier 206 and/or other components in the amplitude path due to changes in condition of the system. This effectively converts the signal from the normalized domain to a PVT-dependent domain. The result is an amplitude control word that that can produce a power amplifier output having a desired amplitude given the present characteristics of the system. For example, the PA normalization component 224 can adjust for changes in the temperature and voltage experienced by the power amplifier.

The PA gain normalization component 224 operates in much the same fashion as the DCO gain normalization device. The exact gain provided by the power amplifier for a particular input is subject to process and environmental factors which cannot be known precisely, so an estimate thereof, $K'_{PA}$, must be determined. The estimate $K'_{PA}$ can be calculated entirely in the digital domain by observing responses to the past gain error corrections. The actual PA gain estimation may involve arithmetic operations, such as multiplication or division and averaging, or an exhaustive or iterative search for optimal values, and can be performed, for example, by dedicated hardware or a digital signal processor (DSP).

The gain normalization component 224 utilizes this estimate to decouple the amplitude information throughout the system from the PVT variations that normally affect the external power amplifier 206. The amplitude information is normalized to a standardized voltage, $V_O$. The digital input to the PA gain normalization 224 is a fixed-point normalized amplitude word (NAW), whose integer part LSB corresponds to $V_O$. The PA gain normalization 224 applies a multiplier to the normalized amplitude word (NAW), the normalized domain input, to obtain the amplitude control word (ACW), a PVT-dependent domain input, such that:

$$ACW = NAW * \frac{V_0/LSB}{K'_{PA}} \qquad \text{Eq. 8}$$

The amplitude control word is provided to a digital-to-analog converter (DAC) 226. The DAC 226 converts the amplitude control word into an analog control signal. In an exemplary embodiment, the DAC 226 can be a flash DAC or a sigma-delta DAC that utilizes a sigma-delta modulator, a comparatively low resolution but high-speed DAC, and a low-pass filter to achieve high-resolution analog-to-digital conversion over the frequency band of interest. The analog control signal is provided to a supply input of the external power amplifier 206.

The external power amplifier module 206 comprises a comparator 230, a linear MOS transistor 232, and a voltage source, $V_{BATT}$. The MOS transistor is driven by the comparator 230, such that the transistor 232 permits the voltage source to provide a regulated drain current to a supply of an amplifier component 233 while the comparator 230 provides a negative feedback to regulate the drain current. A primary input of the comparator is provided by the output of the DAC 226, while a comparison input is provided as a feedback from the supply input. Accordingly, the analog control signal controls the drain current provided to the supply input, and thus the amplitude of the output the external power amplifier 206 when the power amplifier is operated in a saturation mode. The external power amplifier 206 thus amplifies the constant envelope RF signal from the internal power amplifier 218 according to the provided supply voltage. The amplifier 206 output can be provided to the antenna 204 for transmission.

In an exemplary implementation, the system 200 can be utilized for a pulse amplitude modulation (PAM) scheme, a code division multiple access (CDMA) scheme, a time division multiple access (TDMA) scheme and a frequency modulation scheme, such as Global System for Mobile Communications (GSM) or Bluetooth. For example, the system could alternate between an EDGE modulation scheme and a GSM modulation arrangement. When the system is operating as a frequency modulation (e.g., Bluetooth or GSM) system, it assumes a saturation mode, where the external power amplifier module 206 is maintained at a saturation level for maximum efficiency. When the system is performing PAM, the system can enter a linear mode where the voltage supply to the power amplifier is backed off to an appropriate level. The system can be switched between the two modes by altering the amplitude supply word to adjust the supply provided to the external power amplifier 206.

A portion of the amplified RF signal can be provided to the receiver portion 230 for analysis via parasitic coupling at the T/R switch 208 for calibration of the AM-AM predistorter 222. A signal for calibration can also be provided to the receiver 230 through a test multiplexer pin (not shown) or a coupler (not shown) integrated into the integrated transceiver chip. Calibration can be performed using a signal transmitted during normal operation of the transmitter or the transmitter portion 210 can provide a test signal that contains a full range of signals for the system. The calibration process can be performed at the factory, each time the unit is powered, or periodically during the operation of the transceiver. The receiver portion 230 and the transmitter portion 210 utilize a common local oscillator, so the signal will have a frequency equal to that of the reference frequency of the receiver 230. Thus, when the signal is demodulated at the receiver 230, it will contain a strong DC component along with other, less prominent signals within the desired channel. The nonlinear behavior of the external power amplifier 206 and the internal power amplifier 218 signal can cause spectral regrowth, causing the signal to spread to frequencies outside of the desired frequency range.

The attenuated copy of the attenuated signal is provided to a sampling unit 234. In the illustrated example, the sampling unit 234 samples the provided RF signal directly, without the need for prior analog downconverting of the signal. The output of the sampling unit is provided to an analog-to-digital converter (ADC) 236 that converts the sampled signal into a digital signal. In an exemplary embodiment, the ADC 236 can be a sigma-delta ADC that utilizes a sigma-delta modulator, a comparatively low resolution but high speed ADC, and a decimation filter to achieve high-resolution analog-to-digital conversion over the frequency band of interest. The output of the ADC 236 is fed back to a feedback control unit 238.

The feedback control unit 238 works in conjunction with the sampling unit to measure the DC level at the filter and apply the correction necessary to eliminate it. The removal of the DC component allows for a more sensitive measurement of the spectral regrowth within the signal. The corrected signal is provided to a signal evaluation component 240, associated with the digital processor 202. The signal evaluation component 240 measures the spectral regrowth in the signal and calculates appropriate predistortion parameters to mitigate the measured spectral regrowth. These parameters are then provided to the digital AM-AM predistorter 222 as a control input.

Figure 4:
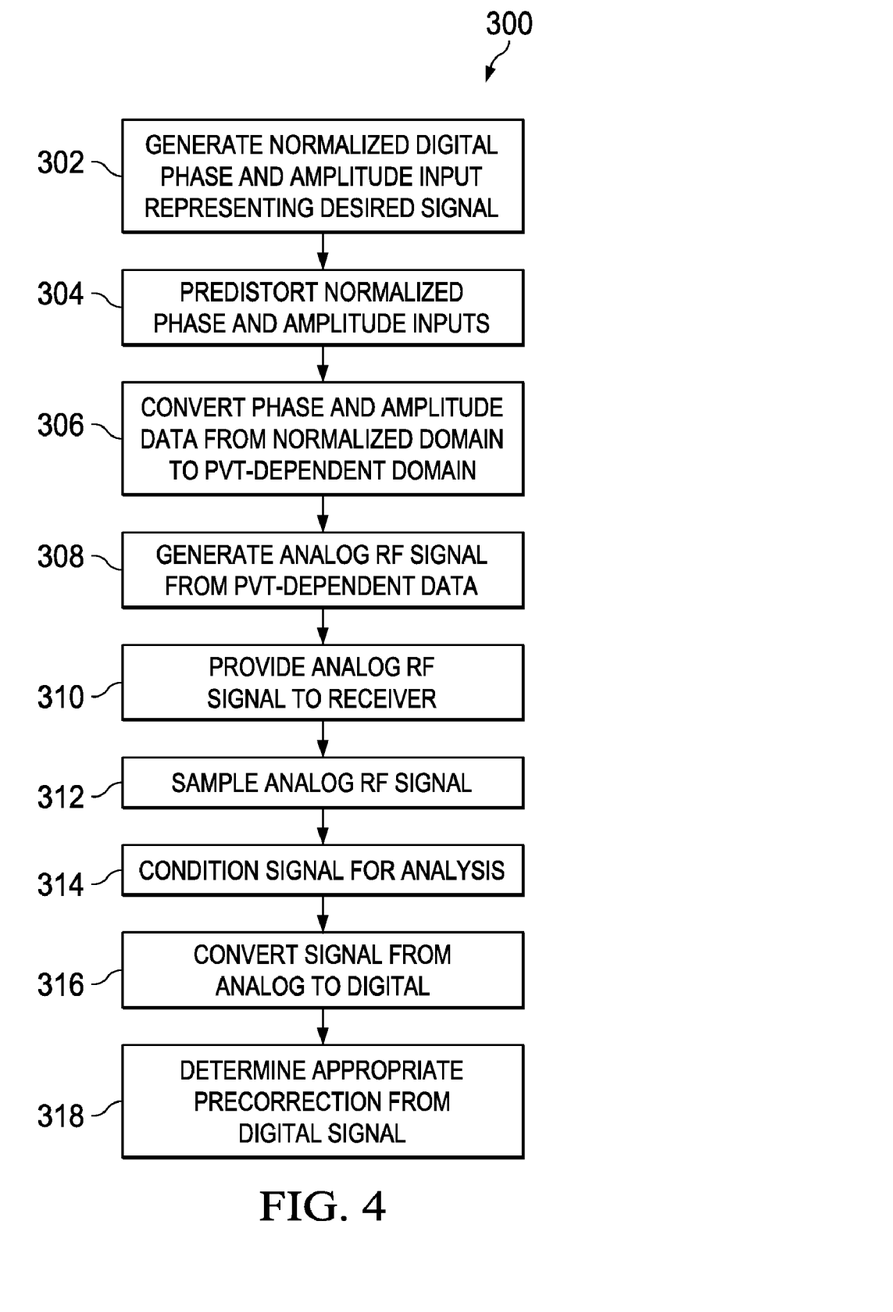
FIG. 4 illustrates a methodology for calibrating a digital predistorter associated with a digital transceiver.

In view of the foregoing structural and functional features described above, certain methods will be better appreciated with reference to FIG. 4. It is to be understood and appreciated that the illustrated actions, in other embodiments, may occur in different orders and/or concurrently with other actions. Moreover, not all illustrated features may be required to implement a method. It is to be further understood that the following methodology can be implemented in hardware (e.g., as one or more integrated circuits or circuit boards containing a plurality of microprocessors), software (e.g., as executable instructions running on one or more processors), or any combination thereof.

FIG. 4 illustrates a methodology 300 for calibrating a digital predistorter associated with a digital transceiver. The methodology 300 begins at 302, where a digital processor generates a normalized amplitude input and a normalized phase input representing a desired signal. For example, the normalized inputs can be control words for one or more digital components in the transceiver operated in a normalized domain. At 304, the normalized phase and amplitude inputs are predistorted to mitigate the effects of nonlinear behavior associated with a power amplifier. This predistortion can be represented by a transfer function defined by one or more predistortion parameters.

At 306, the normalized inputs are converted from a normalized domain to a PVT-dependent domain to account for PVT deviations in the system from an expected standard. For example, the inputs can be adjusted for changes in the temperature or voltage of one or more system components. At 308, the PVT-dependent inputs are used to generate a desired RF signal for the system. For example, the phase modulated input can control a digital frequency synthesizer to provide RF output. Similarly, the amplitude modulated output can control the supply of a power amplifier to control the amplitude of the amplifier output.

At 310, at least a portion of the RF signal is provided to a receiver path of the digital transceiver. At 312, the RF output is sampled to provide a series of discrete time signals. It will be appreciated that the signal can be amplified, filtered, and/or downconverted prior to sampling. At 314, the signal is conditioned for analysis. For example, in one embodiment, a DC offset is provided to the signal to mitigate a strong in-channel DC component of the signal. The specifics of the conditioning will depend upon the characteristics of the signal.

At 316, the signal is converted into a digital signal. In an exemplary embodiment, this can be accomplished via a sigma-delta modulator, a low resolution analog-to-digital converter, and a decimation filter. At 318, the signal is analyzed at the digital processor. The digital processor determines the amount of spectral regrowth (e.g., signal power outside of a desired frequency range or channel) and determines appropriate predistortion parameters to mitigate the spectral regrowth. For example, the parameters can be calculated or optimal parameters can be derived as part of an iterative or exhaustive search. The determined predistortion parameters can be provided to a predistortion component in the system as control input.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An integrated transceiver circuit, comprising:
    a digital polar transmitter path that provides an amplitude/phase signal from a digital input, the transmitter path including at least one digital predistorter that predistorts the digital input to mitigate nonlinearities associated with a power amplifier and a gain normalization component that transfers the digital input from a normalized domain to a domain that is dependent on process, voltage, and temperature (PVT) variations;
    a receiver path associated with the digital transmitter path;
    a coupling element that provides the signal from the transmitter path to the receiver path; and
    a signal evaluator that determines values for at least one parameter associated with the digital predistorter based on the signal.

2. The circuit of claim 1, the digital predistorter preceding the gain normalization component on the transmitter path, such that the digital predistorter predistorts the digital input in the normalized domain.

3. An integrated transceiver circuit, comprising:
    a digital polar transmitter path that provides an amplitude/phase signal from a digital input, the transmitter path including at least one digital predistorter that predistorts the digital input to mitigate nonlinearities associated with a power amplifier that is integrated into the integrated transceiver circuit, the power amplifier accepting digital RE input;
    a receiver path associated with the digital transmitter path;
    a coupling element that provides the signal from the transmitter path to the receiver path; and
    a signal evaluator that determines values for at least one parameter associated with the digital predistorter based on the signal.

4. The circuit of claim 3, the internal power amplifier comprising a Class E switching amplifier.

5. The circuit of claim 3, the digital transmitter path comprising an amplitude modulated path that provides a supply to the internal power amplifier from a first digital input, and a phase modulated path that provides a radio frequency input to the internal power amplifier from a second digital input.

6. The circuit of claim 5, the phase modulated path comprising a digitally controlled oscillator.

7. The circuit of claim 6, the phase modulated path comprising a gain normalization component that adjusts the second digital input for process, voltage and temperature (PVT) variations associated with the digitally controlled oscillator.

8. The circuit of claim 5, the phase modulated path comprising a digital predistorter that adjusts the second digital input to mitigate nonlinearities associated with the power amplifier.

9. The circuit of claim 5, the amplitude modulated path comprising a digital predistorter that adjusts the first digital input to mitigate nonlinearities associated with the power amplifier.

10. The circuit of claim 5, the amplitude modulated path comprising a gain normalization component that adjusts the first digital input for process, voltage and temperature (PVT) variations associated with the internal power amplifier.

11. An integrated transceiver circuit, comprising:
    a digital polar transmitter path that provides an amplitude/phase signal from a digital input, the transmitter path including at least one digital predistorter that predistorts the digital input to mitigate nonlinearities associated with a power amplifier that is external to the integrated transceiver circuit, an amplitude modulated path that controls the supply to the external amplifier according to a first digital input, and a phase modulated path comprising a gain normalization component that adjusts a second digital input for process, voltage and temperature (PVT) variations associated with the digitally controlled oscillator, that provides a radio frequency input to the external power amplifier according to the second digital input;
    a receiver path associated with the digital transmitter path;
    a coupling element that provides the signal from the transmitter path to the receiver path; and
    a signal evaluator that determines values for at least one parameter associated with the digital predistorter based on the signal.

12. An integrated transceiver circuit, comprising:
    a digital polar transmitter path that provides an amplitude/phase signal from the digital input, the transmitter path including at least one digital predistorter that predistorts the digital input to mitigate nonlinearities associated with a power amplifier that is external to the integrated transceiver circuit, the amplitude modulated path comprising a gain normalization component that adjusts a first digital input for process, voltage and temperature (PVT) variations associated with the digitally controlled oscillator, the digital transmitter path comprising an amplitude modulated path that controls the supply to an external amplifier according to a second digital input, and a phase modulated path that provides a radio frequency input to the external power amplifier according to the second digital input;
    a receiver path associated with the digital transmitter path;
    a coupling element that provides the signal from the transmitter path to the receiver path; and a signal evaluator that determines values for at least one parameter associated with the digital predistorter based on the signal.

13. An integrated transceiver circuit, comprising:
a digital polar transmitter path that provides an amplitude/phase signal from a digital input, the transmitter path including at least one digital predistorter that predistorts the digital input to mitigate nonlinearities associated with a power amplifier and being operative to alternate between a saturation mode, in which the power amplifier is driven at saturation, and a linear mode, in which the power amplifier operates within a linear range;
a receiver path associated with the digital transmitter path;
a coupling element that provides the signal from the transmitter path to the receiver path; and
a signal evaluator that determines values for at least one parameter associated with the digital predistorter based on the signal.

14. A method of calibrating a predistortion component in a transceiver system, comprising:
providing a first digital signal, containing amplitude information related to a desired analog signal, to a transmitter path;
providing a second digital signal, containing phase information related to the desired analog signal, to the transmitter path;
predistorting at least one of the first digital signal and the second digital signal in the digital domain according to at least one predistortion parameter;
generating an analog signal from the first digital signal and the second digital signal;
processing the analog signal at a receiver path associated with the transmitter path to determine values for the at least one predistortion parameter; and
converting the first digital signal and the second digital signal from associated normalized domains to process voltage, and temperature (PVT) dependent domains.

15. A method of calibrating a predistortion component in a transceiver system, comprising:
providing a first digital signal, containing amplitude information related to a desired analog signal, to a transmitter path;
providing a second digital signal, containing phase information related to the desired analog signal, to the transmitter path;
predistorting at least one of the first digital signal and the second digital signal in the digital domain according to at least one predistortion parameter;
generating a analog signal from the first digital signal and the second digital signal;
processing the analog signal at a receiver path associated with the transmitter path to determine values for the at least one predistortion parameter; and
adjusting the value of the first digital signal to switch an associated power amplifier from a linear mode of operation to a saturated mode of operation.

16. An integrated transceiver circuit, comprising:
means for producing a digital input;
means for predistorting the digital input to mitigate nonlinear error associated with a power amplifier according to one or more predistortion parameters;
means for converting the digital input from a normalized domain to a process voltage, and temperature (PVT) dependent domain;
means for generating an analog signal from the digital input; and
means for analyzing the analog signal to determine appropriate predistortion parameters for the means for predistorting.

17. The circuit of claim 16, the means for generating the analog signal comprising means for synthesizing a radio frequency signal from a digital input.

18. The circuit of claim 16, the means for analyzing the analog signal including means for applying a direct current (DC) offset to the signal.

19. An integrated transceiver circuit, comprising:
a digital polar transmitter path that provides an amplitude/phase signal from a digital input, the transmitter path including at least one digital predistorter that predistorts the digital input to mitigate nonlinearities associated with a power amplifier, a gain normalization component that transfers the digital input from a normalized domain to a domain that is dependent on process, voltage, and temperature (PVT) variations, and an estimator of step size of the power amplifier;
a receiver path associated with the digital transmitter path;
a coupling element that provides the signal from the transmitter path to the receiver path; and
a signal evaluator that determines values for at least one parameter associated with the digital predistorter based on the signal.

20. An integrated transceiver circuit, comprising:
a digital polar transmitter path that provides an amplitude/phase signal from a digital input, the transmitter path including at least one digital predistorter that predistorts the digital input to mitigate nonlinearities associated with a power amplifier;
a receiver path associated with the digital transmitter path;
a coupling element that provides the signal from the transmitter path to the receiver path; and
a signal evaluator that determines values for at least one parameter associated with the digital predistorter based on the signal and an amount of spectral regrowth of the receiver path signal.

21. A method of calibrating a predistortion component in a transceiver system, comprising:
providing a first digital signal, containing amplitude information related to a desired analog signal, to a transmitter path;
providing a second digital signal, containing phase information related to the desired analog signal, to the transmitter path;
predistorting at least one of the first digital signal and the second digital signal in the digital domain according to at least one predistortion parameter;
generating an analog signal from the first digital signal and the second digital signal; and
processing the analog signal at a receiver path associated with the transmitter path to determine values for the at least one predistortion parameter and estimate spectral regrowth of the analog signal.

22. The circuit of claim 16, wherein the means for analyzing measures spectral regrowth of the analog signal.

23. An integrated transceiver circuit, comprising:
a digital polar transmitter path that provides an amplitude/phase signal from a digital input, the transmitter path including at least one digital predistorter that predistorts the digital input to mitigate nonlinearities associated with a power amplifier;

a receiver path associated with the digital transmitter path;
a coupling element that provides the signal from the transmitter path to the receiver path;
a signal evaluator that determines values for at least one parameter associated with the digital predistorter based on the signal; and wherein the receiver portion of the integrated transceiver circuit comprises a sampling unit with feedback control for adjusting DC offset.

* * * * *